(12) United States Patent
Ludikhuize et al.

(10) Patent No.: US 7,439,771 B2
(45) Date of Patent: Oct. 21, 2008

(54) INTEGRATED INTERFACE CIRCUITRY FOR INTEGRATED VRM POWER FIELD EFFECT TRANSISTORS

(75) Inventors: Adriaan Ludikhuize, Valkenswaard (NL); Frans Schoofs, Valkenswaard (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 111 days.

(21) Appl. No.: 10/574,061

(22) PCT Filed: Sep. 28, 2004

(86) PCT No.: PCT/IB2004/051898

§ 371 (c)(1),
(2), (4) Date: Mar. 30, 2006

(87) PCT Pub. No.: WO2005/031958

PCT Pub. Date: Apr. 7, 2005

(65) Prior Publication Data

US 2007/0063737 A1 Mar. 22, 2007

(51) Int. Cl.
*H03K 19/003* (2006.01)
(52) U.S. Cl. .......................................... 326/68; 326/33

(58) Field of Classification Search .................. 326/68, 326/80–81, 31, 33
See application file for complete search history.

(56) References Cited

U.S. PATENT DOCUMENTS

| | | | | |
|---|---|---|---|---|
| 5,247,212 A | * | 9/1993 | Vinal | ........................ 326/122 |
| 5,469,468 A | * | 11/1995 | Schilling | ..................... 375/130 |
| 5,528,480 A | | 6/1996 | Kikinis | |
| 6,094,039 A | | 7/2000 | Farrenkopf | |
| 6,498,738 B1 | | 12/2002 | Orita | |
| 6,603,291 B2 | * | 8/2003 | Wheeler et al. | ............. 323/224 |
| 2002/0105309 A1 | | 8/2002 | Rutter | |
| 2002/0163040 A1 | | 11/2002 | Kinzer | |
| 2003/0111983 A1 | | 6/2003 | Walters | |

FOREIGN PATENT DOCUMENTS

| | | |
|---|---|---|
| EP | 0 284 979 A | 10/1988 |
| WO | WO 02/063765 A | 8/2002 |

* cited by examiner

*Primary Examiner*—James H Cho
(74) *Attorney, Agent, or Firm*—Michael E. Belk

(57) ABSTRACT

A down converter includes an interface section, which connects the down converter to switches and respective driver circuits, wherein the driver circuits and the switches are combined on an integrated circuit. The driver circuits include a high-side driver circuit, and a low-side driver circuit. The integration of the driver circuits with the switches reduces parasitic inductance, particularly in power applications.

11 Claims, 4 Drawing Sheets

INTEGRATED INTERFACE CIRCUITRY FOR INTEGRATED VRM POWER FIELD EFFECT TRANSISTORS

The present application is related to U.S. Provisional Application Ser. No. 60/432,302, filed on Dec. 10, 2002, and entitled 'Integrated Half-Bridge Circuit.' The disclosure of this application is hereby specifically incorporated herein by references and for all purposes.

Power-converters are often used in power supplies, power amplifiers and motor drives. Down converters, including Buck converters are often used to convert an input voltage to a lower voltage for supplying power to a load, such as a microprocessor. These microprocessors have applicability in personal computers (PC) as well as other electronic devices. In PC applications, the input voltage to the converter is on the order of 12 V, and the required output is on the order of approximately 1.4 V, or a factor of about ten in step-down. Moreover, the required output currents of these converters are increasing to above 50 A, further adding to the design considerations of these circuits, and their devices.

Down-converter circuits often include a control transistor and a synchronous rectifier. These devices are often metal-oxide-semiconductor (MOS) transistors, which are silicon-based field effect transistors (FET). The use of a control FET (CF) and a synchronous rectifier FET (SF) has certain advantages. However, in known circuits these devices are discrete elements or are disposed in modules. Such circuits have certain drawbacks. For example, as the demand for faster switching frequencies increases, parasitic effects in such devices can have a deleterious impact on the ability of the CF and SF to meet these demands.

The losses associated with the on-and-off switching of down converters are beneficially minimized as much as possible. This has certain benefits, such as improving the battery life within the PC and reduction of the heat-dissipation and minimizing the volume. Conversion loss in MOSFET's is determined partly by resistance and partly by the figure of merit of the device, which is proportional to the on resistance, $R_{on}$, and the gate-to-drain charge, $Q_{gd}$.

Moreover, in PC microprocessor applications, the input voltage is approximately 12 V, and the output voltage is approximately 1.4V. The CF and SF switches are relatively high in power and speed, also include a relatively large gate input capacitance, which must be switched into an on and off state relatively quickly. To this end, the switching at the gate occurs at periods on the order of nanoseconds, and the attendant switching currents between the gate and the source are significant, being in the order of Amps.

In many situations, the current drivers for these switches are often remotely located in known devices, and are thus connected to the switches by leads. These lengthy connections further exacerbate inductive effects, and attendant delay due to the time-changing current. This slows down the time rate of change of the voltage at the gate. Furthermore, during the switching to the off-state, an over-shoot ringing may occur. As can be appreciated, the switching of the voltage at the gate can be significantly impeded by these inductive effects.

What is needed therefore is a power down-converter circuit which overcomes at least the short-comings of the known devices described above.

In accordance with an example embodiment, a down converter includes an interface section, which connects the down converter to switches and respective driver circuits, wherein the driver circuits and the switches are combined on a common integrated circuit.

The invention is best understood from the following detailed description when read with the accompanying drawing figures. It is emphasized that the various features are not necessarily drawn to scale. In fact, the dimensions may be arbitrarily increased or decreased for clarity of discussion.

In the following detailed description, for purposes of explanation and not limitation, exemplary embodiments disclosing specific details are set forth in order to provide a thorough understanding of the present invention. However, it will be apparent to one having ordinary skill in the art having had the benefit of the present disclosure, that the present invention may be practiced in other embodiments that depart from the specific details disclosed herein. Moreover, descriptions of well-known devices, methods and materials may be omitted so as to not obscure the description of the present invention.

Figure 1:
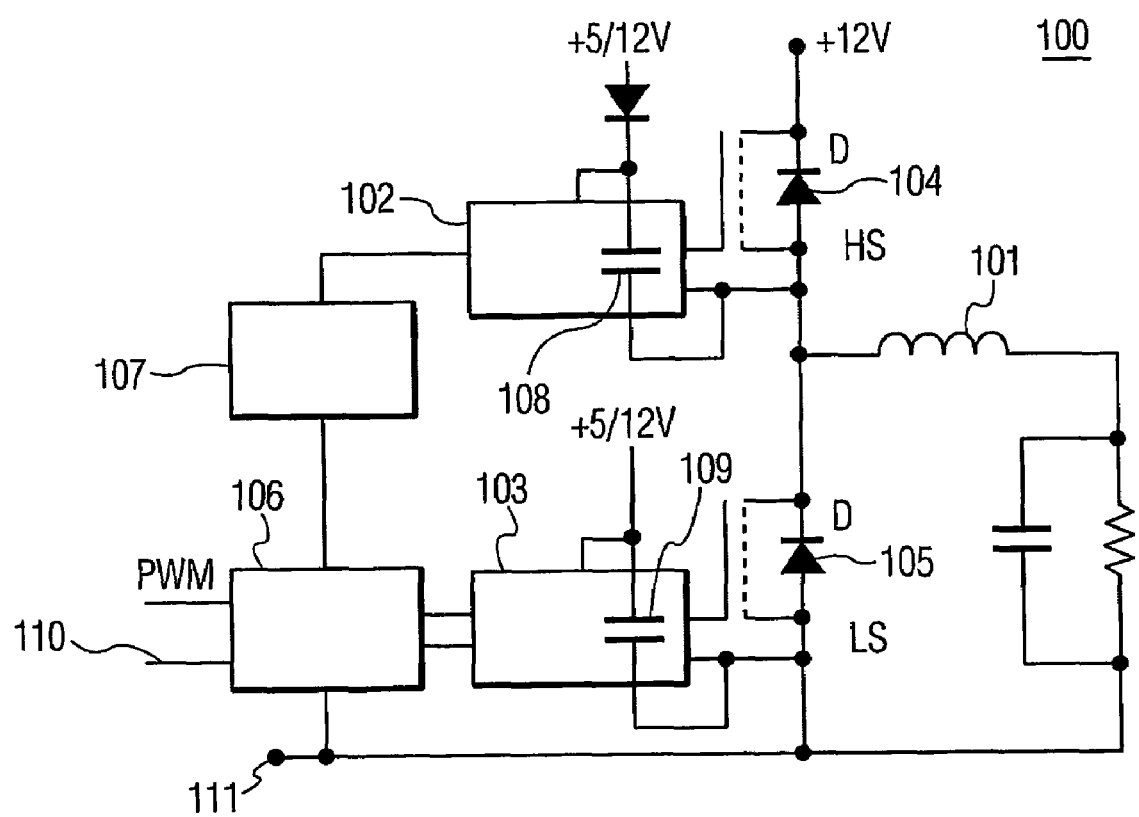
FIG. 1 is a schematic diagram of a down converter in accordance with an example embodiment.

FIG. 1 is a schematic diagram of a down-converter circuit 100 in accordance with an example embodiment. A simple interface section is integrated on a power chip 101, which includes a high side (HS) switch, and a low side (LS) switch as is well known. The power chip 101 may be of the type described in the above-referenced provisional application. A high side (HS) block 102 is a current driver that drives the HS power device 104. A low side (LS) block 103 is also a current driver that drives the low side (LS) power device 104. Both the HS power device and the LS power device are MOS FET devices, and are of the types described in detail in the provisional application referenced above.

In accordance with an example embodiment, the integration of the HS block 102 and the LS block 103 reduces the parasitic inductance and the resistance between the respective blocks and the power FET's, thus improving the access time and reducing the risk of gate pull-up by Miller capacitance between drain and gate.

In known circuits, on a printed circuit board the distance between the driver and Power-FET is 10 mm or more, resulting in a parasitic inductor of at least 10 nH. Charging the Power-FET's input-capacitance of typically 2 nF in 5nsec to 5V means that the current, represented as I=C *dV/dt, is on the order of approximately 2 A. A response of 2 A in 1 nsec requires a voltage, V=L.di/dt, on the order of approximately 20V additionally over the inductor or else the speed of the device is reduced accordingly. This parasitic inductor is reduced typically on the order of at least a factor of 10 by the integration of the elements in accordance with example embodiments described herein.

Upon switching to an off-state, the output current of typically 10 A or more charges the drain-capacitor of typically 2 nF at dV/dt=i/C=5V/ns. This involves a wanted sink-current at the gate (typically $C_{gd}$ is on the order of approximately 0.5 nF) of I=C.dV/dt=2.5 A with rapid access and an additional voltage drop well below the Power-FET's threshold-voltage. The integrated driver of the example embodiments reduces the parasitic inductance and also allows for access to the gate of the Power-FET at multiple locations with low resistance and low delay.

The down-converter 100 includes a differential sense input for signals from a controller chip to decoder block 106. The down converter 100 also includes a level shifter 107 to the HS block 102 and HS switch (CF); also the LS block 103 with LS switch (SyncFET) may have a level-shifter (not shown). The HS block 102 and the LS block 103 each are supplied from external capacitors 108 and 109, respectively. For the HS switch, the capacitor is also part of a bootstrap circuit. Finally, it is noted that the input to the decoder 106 has a signal ground 110, whereas the rest of the integrated circuit uses a power ground 111.

Figure 2A:
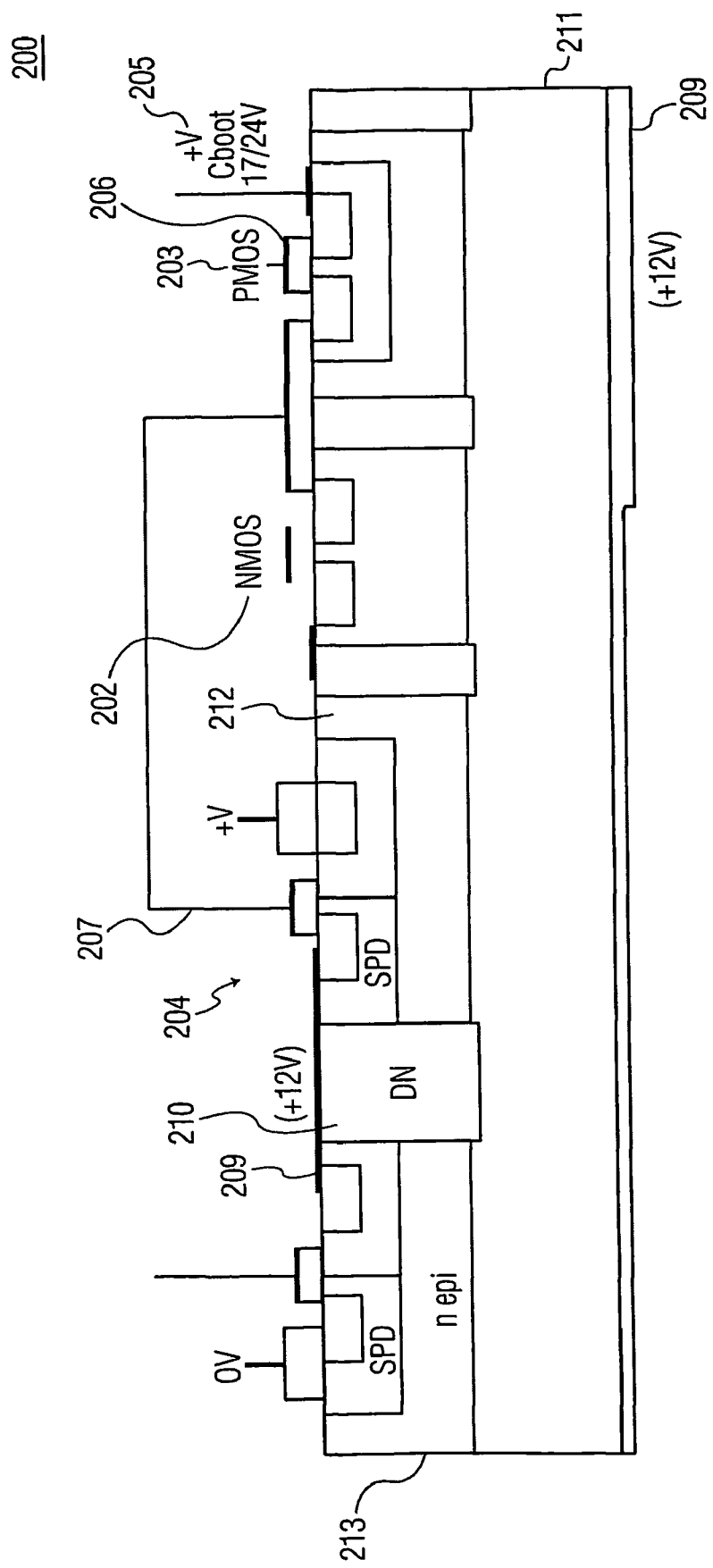
FIG. 2a is a cross-sectional view (High-side) of an integrated circuit of a driver circuit and switches in accordance with an example embodiment.
Figure 2B:
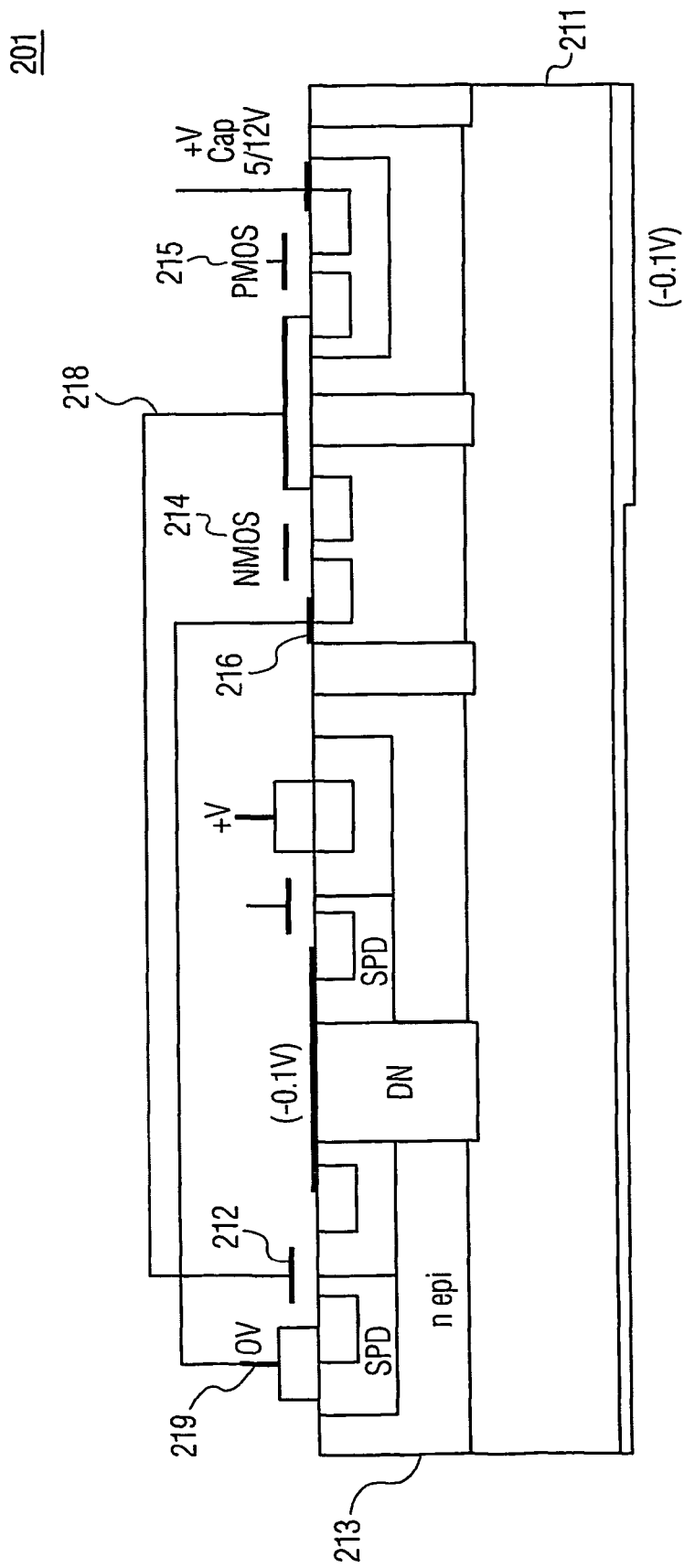
FIG. 2b is a cross-sectional view (Low-side) of an integrated circuit of a driver circuit and switches in accordance with an example embodiment.

FIGS. 2a and 2b show the current drivers of an example embodiment monolithically integrated on a common substrate. It is noted that in the example embodiments of FIGS. 2a and 2b, the integration is a monolithic integration in silicon. It is noted that other semiconductor materials and technologies, such as SiGe may be used in carrying embodiments. The details of the processing and structures are generally omitted from the description as these are well-known to one skilled in the semiconductor device and processing arts.

FIG. 2a shows the HS driver block 200 for the HS switch in accordance with an example embodiment. The HS driver 200 is substantially the same as that which was described in connection with the example embodiment of FIG. 1, and the HS switch (also referred to herein as the HS power switch) substantially the same as that described in the above-referenced provisional application. FIG. 2b shows the LS driver block 201 for the LS switch (also referred to herein as the LS power switch) in accordance with an example embodiment. The LS driver block 201 is substantially the same as that which was described in connection with the example embodiment of FIG. 1, and the LS switch substantially the same as that described in the above-referenced provisional application. Finally, it is noted that the HS driver block and the LS driver block of the example embodiments of FIGS. 2a and 2b beneficially are provided on a common substrate (the same integrated circuit), which in the example embodiments described herein is a highly n-doped silicon substrate. In the present discussion these are separated for purposes of clarity.

Turning initially to FIG. 2a, the HS driver block is shown. The HS block 200 is a CMOS block, which comprises a power NMOS stage 202 and a power PMOS stage 203; the 'ground'-sides of this CMOS-block are connected to Output (209-210). The HS CMOS block 200 drives a HS Power FET, which functions as HS Switch 204 as shown. In operation, the PMOS stage 203 charges the gate 206 from the C-boot 205, and an NMOS stage 204 discharges the gate to the output voltage 209 (via heavily doped sinker 210), which is here illustratively given at +12 V. In the example embodiment, the substrate 211 is heavily doped as well, and provides the connection to the p-well 212 of the HS switch.

As described herein, the HS CMOS block 200 needs a high-side latch circuit that is driven by a level shifter; this level-shifter adapts the 5V-signals related to power-ground from the decoder to 5V signals between Gate and Source related to the source of the HS-switch which jumps up and down according to the output-voltage "Out". Moreover, the HS CMOS block requires an external bootstrap capacitor and a (25V) bootstrap diode, which is indicated in FIG. 1. As a diode is difficult to integrate, an external diode (not shown) is required.

In an example embodiment shown in FIG. 2b the LS CMOS block 201 drives an LS Power FET gate 212 of an LS Switch 213, both relative to power-ground. The LS CMOS block 201, like the HS CMOS block 200 includes an NMOS stage 214 and a PMOS stage 215. The 'ground'-side of this CMOS-block (p-well 216) of the LS driver 218 is connected to a power ground 219. The $n^+$ substrate 211 ("Out") moves between +12V and Zero and can also for a short time be at approximately −0.1 V, but must remain less than −0.7 V relative to the p-well 216 if the LS Power FET (LS Switch 213) is not yet switched on. This latter situation will create conduction in parasitic diodes which are part of a parasitic NPN structure (NMOS drain, PMOS well), which involves additional dissipation and charge collection in the integrated circuit. This must be restricted to minimum by a quick turn-on of the LS power-switch. Finally, the LS CMOS block 201 also beneficially may have a capacitor and even may have a level shifter in case of large voltage-differences in the ground-rail.

As referenced before, parasitic currents can arise during operation of the down-converters of example embodiments thus described. In the example embodiment of FIGS. 2a and 2b, if the HS switch 204 is in an on-state, the substrate 211 is charged to 12 V, and current flows in the load inductance of the down-converter. If the HS switch 204 is in an off-state, the load inductance pulls the substrate 211 to between −0.1 V and −0.7V, depending upon the turn-on time of the LS switch 213. This can result in spike diode currents to the p-well of the NMOS and PMOS stages, since the p-wells are connected to the power-ground 219; this also can create spikes in NPN conduction.

Figure 3:
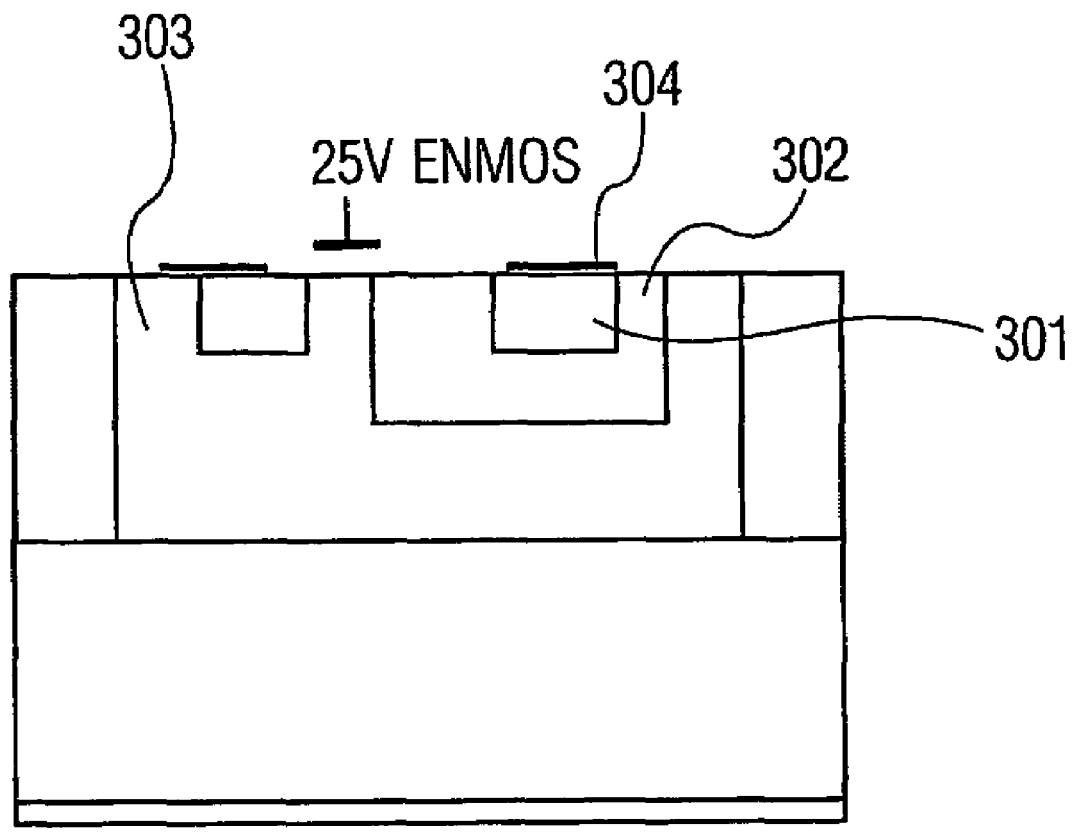
FIG. 3 is a level shifter in accordance with an example embodiment.

In FIG. 1, a HS level shifter 107 requires a relatively high voltage NMOS device, of approximately 25V; an example embodiment is shown in FIG. 3. The HS level shifter 300 may be disposed on a common substrate with the HS and LS blocks and Power FET's described above. This may be fabricated in an integrated fashion with the NMOS structure 301 in a p-type well 303, where the PMOS n-well 302 functions as the drift region for the NMOS drain 304. If the source/p-well is connected to a signal-ground, which is the input from the controller, it can create issues if the signal-ground differs by several volts from the power-ground due to inductance. In an example embodiment, a different drive is implemented from the input decoder. The source/p-well of the level shift are illustratively connected to the power ground and have the same problem described in conjunction with the LS CMOS block.

In this example embodiment, the input decoder must split the signals for the LS and HS CMOS blocks (200 and 201) for break-before-make timing. In an example embodiment, a differential signal sense may be used for the input from the controller. Illustratively, this may be effected using a PMOS device, which senses a difference between a VRM signal line and a signal-ground line. The two lines are then connected to a source and gate of a PMOS stage in an example embodiment. The difference is obtained in the drain current of the PMOS stage. This is converted to a Gate-to-Source (GS) signal for the transistor of the level-shifter circuit by a resistor between the gate and the source. This accounts for differences between the local power ground and the signal ground at the controller, taken at the central voltage sensing point.

The invention being thus described, it would be obvious that the same may be varied in many ways by one of ordinary skill in the art having had the benefit of the present disclosure. Such variations are not regarded as a departure from the spirit and scope of the invention, and such modifications as would be obvious to one skilled in the art are intended to be included within the scope of the following claims and their legal equivalents.

The invention claimed is:

1. A down converter comprising:
   at least one switch;
   an interface section, which connects the down converter to the at least one switch;

at least one driver circuit is connected to the at least one switch; and a decoder connected to the at least one switch, wherein the at least one driver circuit and the at least one switch are disposed on a common integrated circuit, and wherein the decoder is connected to a signal ground which is different from a power ground of the common integrated circuit, wherein the at least one driver circuit is a high-current driver circuit, and the at least switch is a power switch.

2. The down converter as recited in claim 1, wherein the interface section is monolithically integrated with the at least one switch.

3. The down converter as recited in claim 1, wherein a parasitic inductor between the at least one driver circuit and the at least one switch is approximately 1 nH or less.

4. The down converter as recited in claim 1, wherein the integrated circuit is a silicon-based integrated circuit.

5. The down converter as recited in claim 1, wherein the integrated circuit is a SiGe-based integrated circuit.

6. A down converter comprising:

at least one switch;

an interface section, which connects the down converter to the at least one switch;

at least one driver circuit is connected to the at least one switch; and a decoder connected to the at least one switch, wherein the at least one driver circuit and the at least one switch are disposed on a common integrated, circuit, and wherein the decoder is connected to a signal ground which is different from a power ground of the common integrated circuit;

wherein the down converter includes a high-side current driver which is connected to a high-side power switch.

7. The down converter as recited in claim 6, wherein the high side current driver is connected to a level shifter.

8. The down converter as recited in claim 6, wherein the high-side current driver is a CMOS device.

9. A down converter comprising:

at least one switch;

an interface section, which connects the down converter to the at least one switch;

at least one driver circuit is connected to the at least one switch; and a decoder connected to the at least one switch, wherein the at least one driver circuit and the at least one switch are disposed on a common integrated circuit, and wherein the decoder is connected to a signal ground which is different from a power ground of the common integrated circuit;

wherein the down converter includes a low-side current driver which is connected to a low-side power switch.

10. The down converter as recited in claim 9, wherein the decoder is connected to the low side current driver and to a level shifter.

11. The down converter as recited in claim 9, wherein the low-side current driver is a CMOS device.

\* \* \* \* \*